310-322

7/22/86 OR 4,602,184 SR

United States Patent [19]

Meitzler

[11] Patent Number: 4,602,184

[45] Date of Patent: Jul. 22, 1986

[54] APPARATUS FOR APPLYING HIGH FREQUENCY ULTRASONIC ENERGY TO CLEANING AND ETCHING SOLUTIONS

[75] Inventor: Allen H. Meitzler, Ann Arbor, Mich.

[73] Assignee: Ford Motor Company, Dearborn, Mich.

[21] Appl. No.: 666,017

[22] Filed: Oct. 29, 1984

[51] Int. Cl.[4] .......... H01L 41/08

[52] U.S. Cl. .......... 310/322; 310/323; 310/334; 366/118; 366/127

[58] Field of Search .......... 310/26, 322, 323, 328, 310/334, 337, 325; 366/113, 117, 118, 120, 127, 600; 134/184, 192

[56] References Cited

U.S. PATENT DOCUMENTS

| | | | |
|---|---|---|---|
| 2,514,080 | 7/1950 | Mason | 310/325 X |
| 3,180,626 | 4/1965 | Mettler | 310/322 X |
| 3,191,913 | 6/1965 | Mettler | 310/322 X |
| 3,198,489 | 8/1965 | Finch | 310/334 |
| 3,240,963 | 3/1966 | Sasaki | 310/334 |
| 3,245,892 | 4/1966 | Jones | 366/127 X |
| 3,535,159 | 10/1970 | Shiro | 310/334 X |
| 3,591,862 | 7/1971 | Winston | 310/322 |
| 3,893,869 | 7/1975 | Mayer et al. | 134/86 |
| 3,945,618 | 3/1976 | Shoh | 366/118 |
| 4,261,086 | 4/1981 | Giachino et al. | 29/25.41 |
| 4,401,131 | 8/1983 | Lawson | 134/149 |
| 4,483,571 | 11/1984 | Mishiro | 310/323 |

FOREIGN PATENT DOCUMENTS 103267 8/1979 Japan .

*Primary Examiner*—Mark O. Budd

*Attorney, Agent, or Firm*—Paul K. Godwin, Jr.; Clifford L. Sadler

[57] ABSTRACT

High frequency ultrasonic energy is applied to a liquid medium to produce low micron size cavitation in the liquid for enhancing the cleaning or etching action of exposed surfaces within the liquid. An ultrasonic transducer is bonded to a vibration coupler which is formed of a material that is inpervious to the liquid medium and functions to efficiently transmit the ultrasonic vibrations to the liquid medium. The coupler is partially immersed in the liquid while maintaining the transducer elevated above the liquid.

6 Claims, 10 Drawing Figures

APPARATUS FOR APPLYING HIGH FREQUENCY ULTRASONIC ENERGY TO CLEANING AND ETCHING SOLUTIONS

BACKGROUND OF THE INVENTION

1. Field of the Invention

The present invention is directed to the field of surface cleaning and etching of silicon substrates and more specifically to an improved apparatus for enhancing those processes.

2. Description of the Prior Art

The use of ultrasonic energy to generate cavitation in cleaning solutions and thereby enhance cleaning action is a common, well-established practice and is described in U.S. Pat. Nos. 3,198,489; 3,240,963; and 4,401,131.

Ultrasonic agitation has also been used to enhance the ability of etching solutions to etch materials under certain conditions. One description of such use is included in a paper entitled *TEM Observation of Pyramidal Hillocks Formed On (001) Silicon Wafers During Chemical Etching,* by Fumio Shimura, J. Electrochem. Soc.: SOLID-STATE SCIENCE AND TECHNOLOGY, April, 1980, pgs. 910–913.

Both cleaning and etching processes are important in the production of many types of semiconductor devices. However, in the past, the quality achieved by the application of ultrasonic energy has been limited by the types of sources used in high-energy ultrasonic equipment that is commercially available and due to the fact that the prior art equipment operated mostly in the 20–50 KHz frequency range.

The basic mechanisms associated with ultrasonic cavitation are understood to be due to microscopic cavities or voids that exist within liquids. Upon application of a high amplitude ultrasonic pressure wave, a cavity will grow by extracting energy from the sonic field and concentrating it in the vicinity of the void. The cavity grows to a size where the motion of the cavity wall resonates with the driving force of the incident wave motion. After some time, the motion of the cavity wall becomes unstable and the cavity collapses. The energy stored in the region around the wall causes a transient, localized turbulent flow accompanied by high stresses. It is this combination of turbulence and high stresses that produces the beneficial action useful in cleaning or etching.

Theoretical studies have indicated that the relationship between cavity radius and linear resonant frequency, in water, is as shown in FIG. 1. This relationship indicates that at a frequency of 1 MHz, for instance, the radius of the resonant cavity should be about 4 microns, as indicated by the dashed lines. The dependency of resonant cavity size to frequency is basic to the benefits expected from ultrasound to process semiconductor devices. By achieving a smaller cavity size, there is an improved ability to clean or etch structures with low micron sized definition. Additionally, since the smaller cavity size inherently stores less energy, less energy is released on collapse of the void and the result is a milder cleaning action than would occur by cavitation produced by KHz frequencies.

A conventional (prior art) ultrasonic cleaning apparatus is shown in FIG. 2 to illustrate some of the limitations present in the art. A liquid cleaning solution 12 is contained in a stainless steel tank 10. Piezoelectric transducers 14 are bonded to the bottom of the tank and may number one or more. Those transducers 14 are usually three or four inches in diameter and approximately ¼ to ½ inch thick. It is very common that the transducer 14 will resonate somewhere in the range of 25 to 50 KHz. The transducer 14 is driven by an electrical power oscillator 16 that may be operated directly from a 110 volt AC (60 Hz) line. The resulting waveform applied to the transducer 14 is a pulse of sinusoidal oscillations (25 KHz to 50 KHz) modulated at a 60 Hz rate. This type of construction minimizes the cost of a power supply and at the same time, by modulating the wave motion radiated into the tank, prevents the build up of any steady-state, standing wave patterns that would otherwise result in dead spots.

The major disadvantage of the conventional tank is that it cannot be operated at MHz frequencies to obtain the desired low micron size cavitation. For instance, even with thin transducers, the stainless steel tank 10 becomes extremely lossy at high frequencies. In addition, if cleaning or etching is to be performed with solutions that attack the stainless steel tank 10, the corrosive liquid has to be contained in a beaker which is immersed in a water bath in the tank. A significant loss of energy takes place as a result of reflections from the boundry surfaces defined by the beaker.

In U.S. Pat. No. 3,893,869, an attempt was made to avoid the use of transducers radiating through the tank wall by simply immersing high-frequency transducers directly into a cleaning bath. Such an arrangement would not be suitable for an etching process since the liquid would most likely attack and destroy the transducer material or the transducer electrodes.

SUMMARY OF THE INVENTION

It is an object of the present invention to provide an ultrasonic transducer and a low-loss coupler apparatus that efficiently produces low micron sized cavitation in a liquid medium.

It is another object of the present invention to provide an apparatus that makes it possible to apply megahertz cavitation to either a cleaning or an etching process.

The above-mentioned objects are achieved through the unique combination of a piezoelectric transducer element configured to be bonded to an elongated edge of a coupling plate. The coupling plate is partially immersed in a liquid medium and functions to transmit the mechanical vibrations produced by the transducer to the liquid medium.

A high frequency electrical signal (approximately 1 MHz) is applied to opposing electrodes on the transducer and the transducer responsively produces a mechanical pressure wave motion of the same frequency at the edge of the coupler plate. This wave motion travels the length of the plate and when reaching the liquid medium transfers its energy to the liquid medium. As such, cavitation occurs in the liquid medium (approximately 4 micron radius).

The described combination improves over the prior art technique in that it efficiently converts electrical energy to sonic energy and evenly distributes the sonic energy throughout the volume of the liquid medium. In addition, the unique combination isolates the transducer from the liquid medium, thereby making the apparatus suitable for use in a cleaning or etching process where corrosive liquids are employed.

DETAILED DESCRIPTION OF THE PREFERRED EMBODIMENT

Figure 3A:
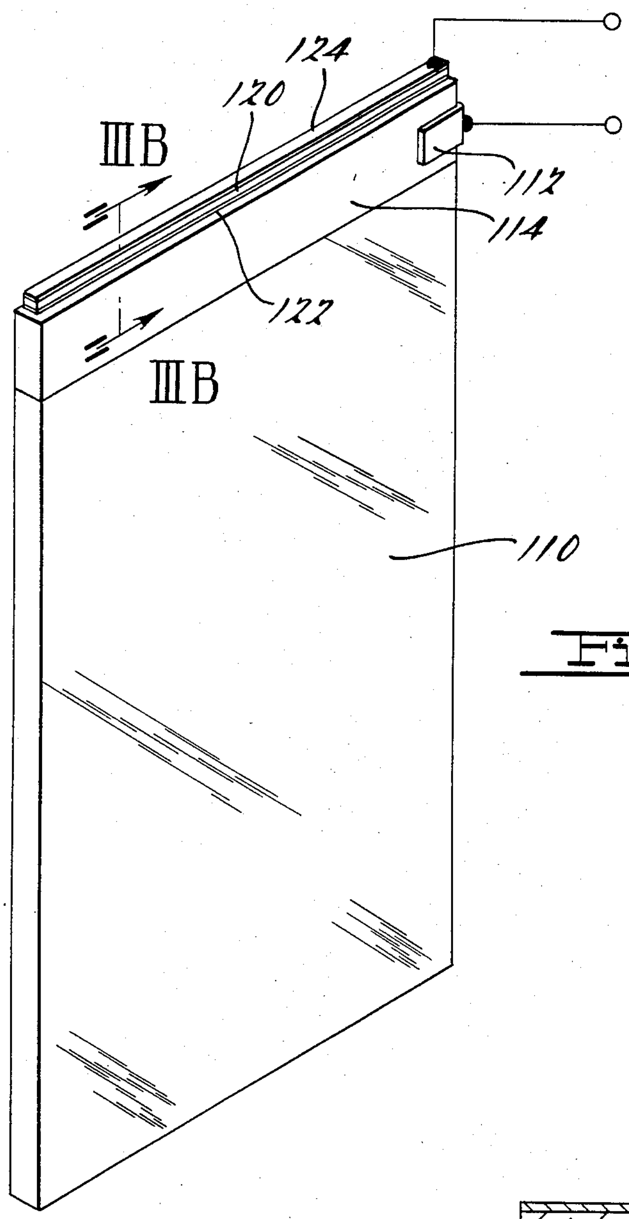
FIGS. 3A and 3B are detailed views of the preferred embodiment of the present invention.
Figure 3B:
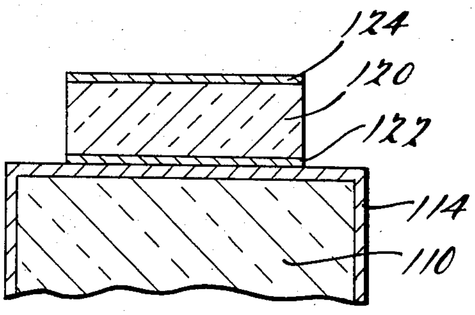
Figure 4:
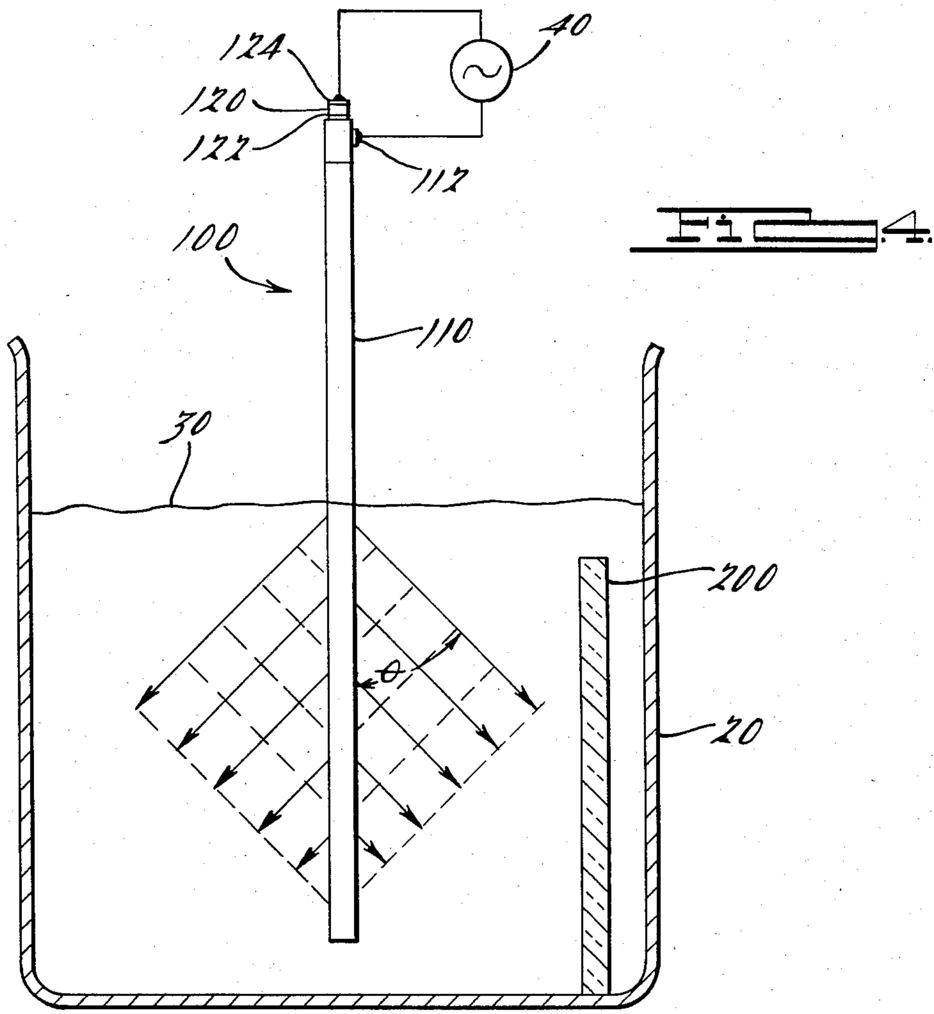
FIG. 4 illustrates the preferred embodiment of the present invention within a liquid medium.

The following discussion of the invention is made with concurrent reference to FIGS. 3 and 4.

Figure 1:
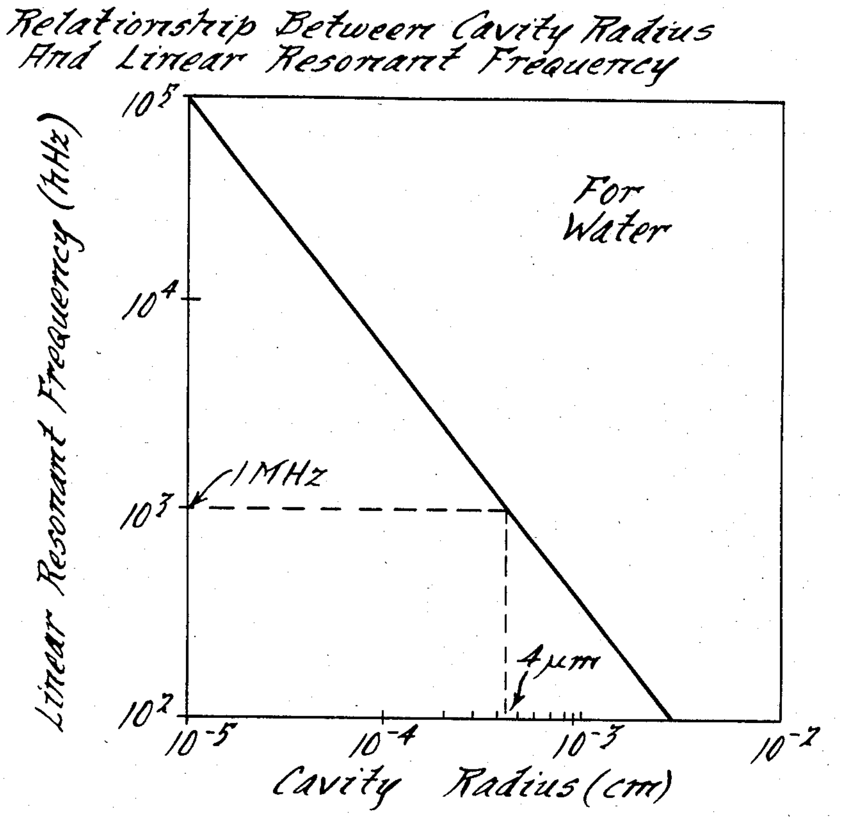
FIG. 1 is a plot of the relationship between cavity radius and linear resonant frequency that occurs in water.
Figure 2:
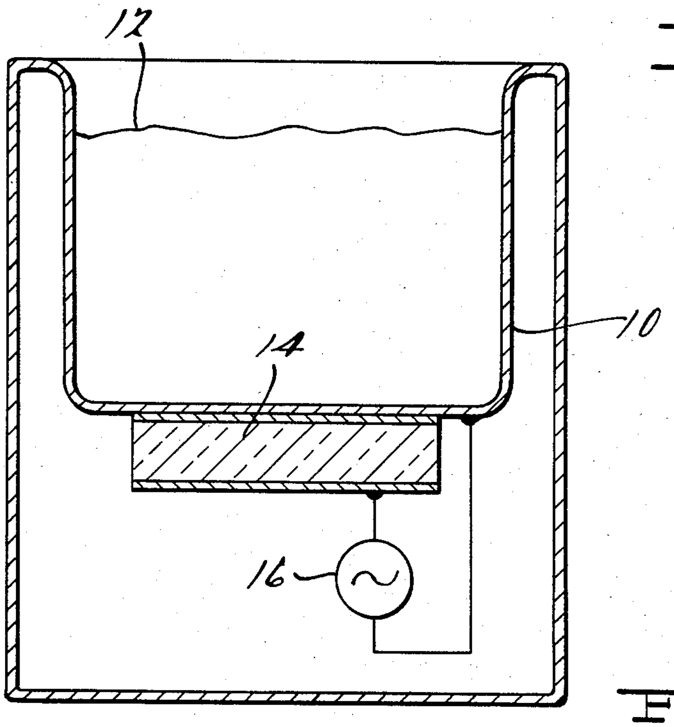
FIG. 2 illustrates a cross-section of a conventional ultrasonic cleaning tank.

The invention 100 includes an elongated piezoelectric transducer 120, such as a piezoceramic material PZT that is poled in its thickness direction perpendicular to the length. The rectangular bar-shaped transducer 120 contains opposing electrodes 122 and 124 which, in this case, are fired-on silver paste electrodes that extend the length of the piezoceramic material. The transducer is dimensioned to resonate in the lowest thickness-longitudinal mode at the desired frequency for radiating mechanical energy. In this case the desired frequency is approximately 1 MHz so as to obtain low micron size cavitation as indicated in FIG. 1. The transducer 120 is bonded to the upper edge of a rectangular coupling means 110 with an epoxy adhesive.

The coupling means 110 is used to transmit the ultrasonic energy generated by the transducer 120 into a liquid bath 30. In this case, a glass plate was selected as the coupling means 110 having a thickness of about 0.1 inches, a width of inches and a length of six inches. The upper end of the plate 110 is plated with silver 114 to provide a conductive coating. The lower electrode 122 of the transducer is epoxy bonded to the silver plated end of the plate 110 and electrical metal to metal contact is maintained between those two elements. A copper strap is also bonded to the silver plate 114 to provide a terminal for the electrical transducer driver.

An optimum frequency for the wave motion propagating through the coupling plate 110 results from the fact that, for the lowest longitudinal mode of propagation in a plate, there is a frequency at which the displacement factor of particles at the surface has only a perpendicular component. This frequency, $F_w$ is given by the equation:

$$F_w=(0.707)\,(V_s/T_p),$$

in which $V_s$ is the velocity for shear waves in the elastic plate and $T_p$ is the thickness of the plate. Since glass is manufactured commercially with a wide range of compositions the values of $V_s$ can be found to range from about 2,500 to 3,700 M/S. The preferred embodiment was configured with a glass plate with a $V_s$ of approximately 2,910 M/S. This provides an optimum frequency of approximately 0.81 MHz.

As longitudinal wave motion in the plate travels into the region of the plate immersed in the liquid bath 30, the undulating displacements at the major faces of the plate cause wave motions to be radiated into the liquid 30. The arrows in FIG. 4 show the directions of propagation, while the dashed lines represent surfaces of constant phase in the wave. As the drawing indicates, the wave motion in the liquid, on either side of the plate 110 comes off at an angle $\theta$ given by the equation:

$$\cos\theta=V_w/V_p$$

in which $V_w$ is the velocity of compressional waves in the liquid and $V_p$ is the phase velocity of the longitudinal wave motion in the plate. (In water, $V_w$ is 1,500 M/S and in glass, $V_p$ is about 2,000 M/S in the vicinity of $F_w$.)

An electronic oscillator/amplifier 40, capable of generating an electrical signal at the required frequency and sufficient power to produce cavitation in the liquid, is connected across the transducer 120. Operative experiments indicate that cavitation may be produced in water solutions under conditions where one watt of electrical power is supplied to the transducer for each 400 mls of liquid. The driver 40 may also be selected to provide modulation of the frequency on the order of approximately ±5% in order to prevent any dead spots from arising due to standing wave patterns. Modulating or sweeping the frequency will cause the wave front to change direction. This is due to the fact that phase velocity of the wave motion in the plate 110 is a function of frequency. This also assures a uniform distribution of sonic energy in the liquid.

Experiments were made with the apparatus shown in FIG. 4. The effects of the invention were most dramatic in a process to etch a shallow well with a flat smooth bottom and straight side walls in a silicon substrate. Such a well structure is formed, for example, in the SCAP (silicon capacitive absolute pressure) sensor described in U.S. Pat. No. 4,261,086. In order to produce a structure of this sort, it is common practice to use an anisotropic etchant such as diluted KOH (potassium hydroxide). In the case of the SCAP sensor, the well is rather shallow (approximately 5 microns deep).

In the experiment, two samples of n-type doped (100) silicon were cleaned and oxidized using conventional procedures. The the oxide layers were coated by a photoresist layer. The photoresist was exposed to define the well area and developed. Etching of the exposed oxide layer in the defined well area was then performed using an HF acid solution. The oxide etch to define a mask was done without ultrasonic agitation. After the openings in the oxide masking layer were formed, a 33% KOH solution was used to etch the exposed silicon. In carrying out the etch, the solution was first heated to 80° C. The silicon was exposed to the etching for six minutes in order to obtain a well approximately 5 microns deep. The final step of the procedure was to rinse a sample in distilled water.

Figure 5A:
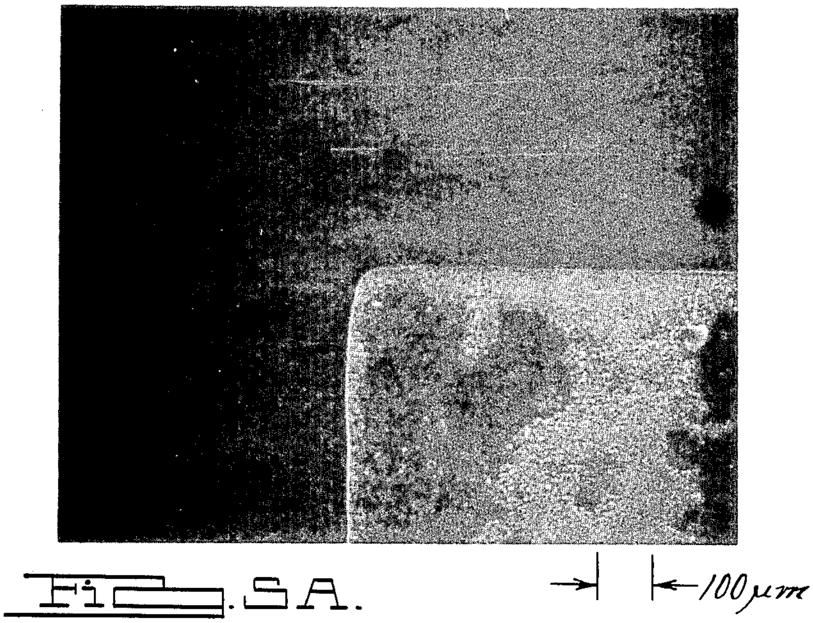
FIGS. 5A and 5B are photomicrographs of a control sample and a test sample taken at a normal incidence angle.
Figure 6A:
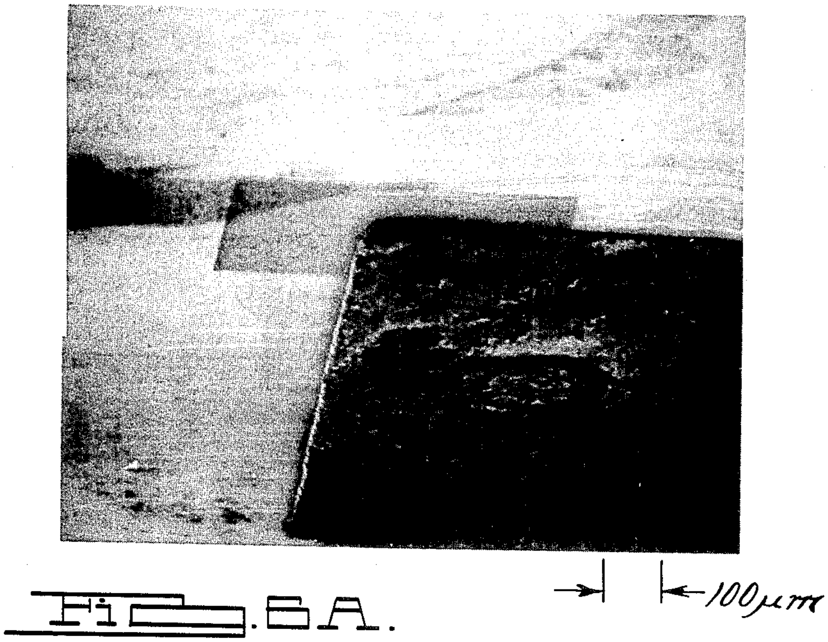
FIGS. 6A and 6B are photomicrographs of the control sample and test sample taken at an oblique incidence angle.

The control sample was etched using this procedure without ultrasonic agitation present in the KOH bath. The appearance of the well obtained in the control sample is shown in FIGS. 5A and 6A. The photomicrographs of FIGS. 5A and 6A were obtained using a scanning electron microscope at normal and oblique angles respectively. As FIGS. 5A and 6A clearly show, incomplete etching occurred, which resulted in pitting at the bottom of the well and poor line definition on the sides of the well.

Figure 5B:
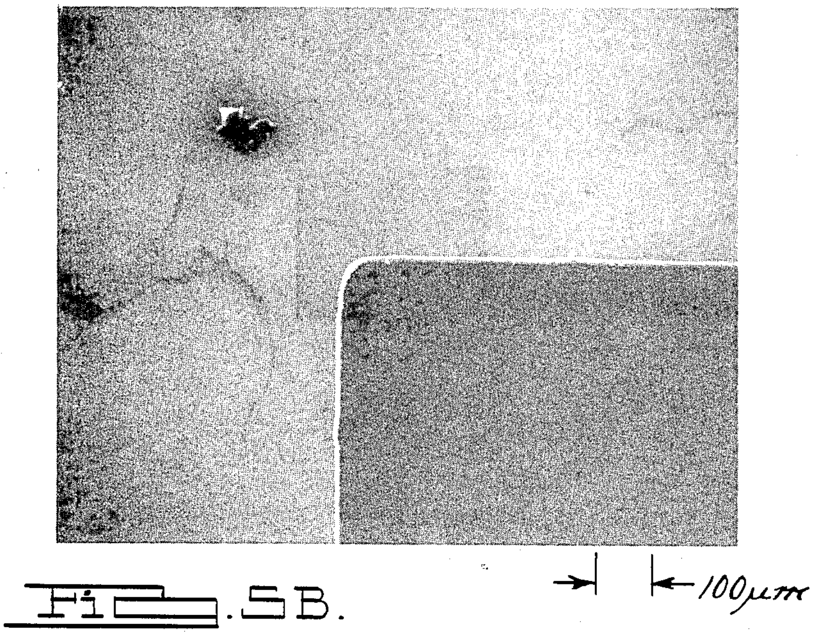
Figure 6B:
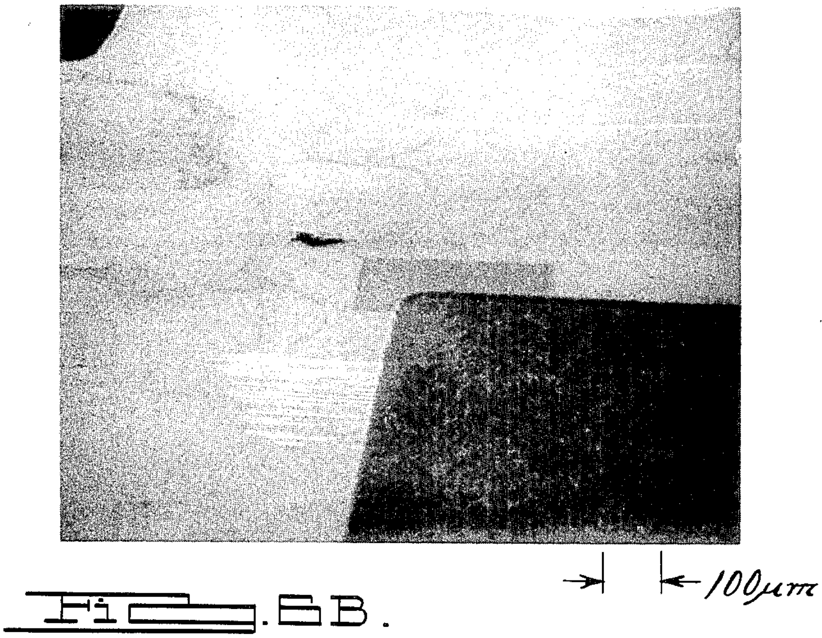

The second sample was etched in the same bath with all the procedures the same as the control sample except that ultrasonic agitation was introduced during the etch in the KOH solution by employing the present invention as shown in FIG. 4. The photomicrographs shown in FIGS. 5B and 6B indicate the dramatic improvement offered by the present invention in that the second sample was etched cleanly and the edges are precisely defined for the well. The bottom surface of the well is very smooth, without putting on residue.

The ultrasonic agitation was introduced through the glass plate 110 into KOH solution within the container 20 (a 500 ml beaker). The second sample 200 was arranged to be approximately parallel to the plate 110. The RF driving voltage to the transducer 120 was about 150 volts to peak-to-peak, corresponding to a power input of about three watts. The driving signal was obtained from a signal generator 40 at a frequency that was swept from 0.70 MHz to 1.0 MHz at a one second rate in order to provide the change in radiated wave direction as discussed above.

It is apparent that a major advantage of the present invention is that it provides a convenient way to introduce high frequency ultrasonic energy into a hot, corrosive, caustic solution without adversely affecting the transducer or its electrical connections. While the KOH solution used in the foregoing example does not visably attack the glass, other solutions may. In such cases fused quartz could be substituted for the plate 110 since it also has mechanically elastic properties which allow wave proagation to be transmitted from the transducer to the liquid with low losses.

Figure 7:
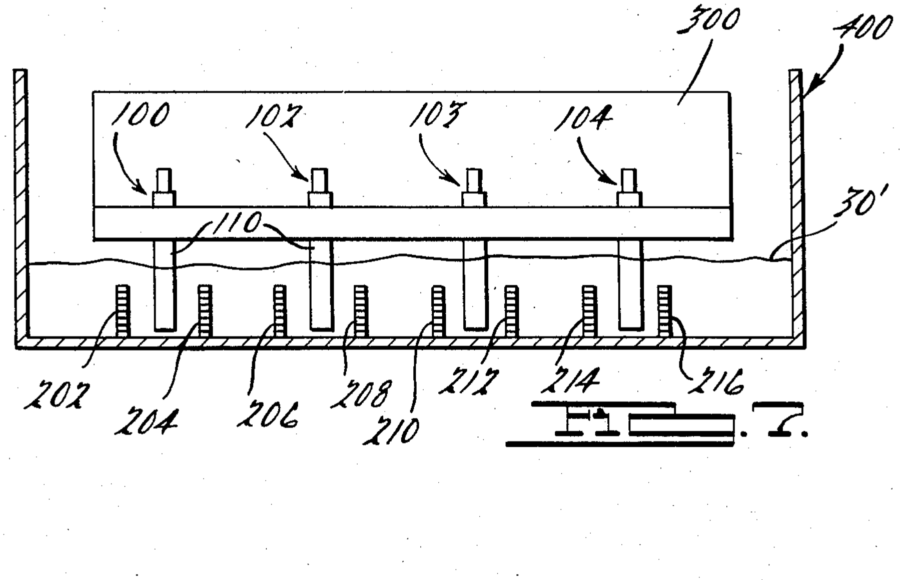
FIG. 7 is a conceptual view of the present invention as applied to a production environment.

FIG. 7 illustrates a production concept in which a wafer carrier 400 containing a plurality of silicon wafers 202, 204, 206, 208, 210, 212, 214 and 216 are illustrated as being in an etching 30'. A plurality of transducer assemblies 100, 102, 103 and 104 are disposed on a holder 300 so as to provide ultrasonic cavitation to corresponding pairs of wafers in the liquid etching bath 30'. FIG. 7 illustrates the concept of using the present invention in a production related environment to achieve higher quality etching while at the same time preserving the integrity of the transducers.

Experiments have determined that an energy density of approximately 2.5 watts per liter is required to produce cavitation in the one MHz frequency range. Therefore, since the volume of liquid required to process a carrier load of wafers should be about two to three liters, the total power requirement to utilize the present invention is indeed modest.

It will be apparent that many modifications and variations may be implemented without departing from the scope of the novel concept of this invention. Therefore, it is intended by the appended claims to cover all such modifications and variations which fall within the true spirit and scope of the invention.

I claim:

1. An apparatus for applying high frequency energy to a liquid medium comprising:

transducer means formed by an elongated piezoelectric material responsive to a high frequency electrical signal for generating a high frequency vibration and located external of said liquid medium;

means formed by a mechanically elastic material having opposing planar surfaces and an upper edge, with said transducer means bonded to its upper edge and being partially immersed in said liquid medium for transmitting said high frequency vibrations from said transducer means to said liquid medium, wherein said transmitting means is a glass plate selected to have a predetermined value of velocity for conducting mechanical shear waves ($V_s$) and to have a plate thickness ($T_p$) according to the relationshp $F_w T_p = (0.707) V_s$ where $F_w$ corresponds to the high frequency vibration being transmitted.

2. An apparatus as in claim 1, wherein said high frequency signal is frequency modulated so as to prevent the occurrance of standing waves in said liquid medium.

3. An apparatus as in claim 1, wherein said high frequency is on the order of approximately 1 MHz.

4. An apparatus as in claim 3, wherein said elongated piezoelectric transducer contains a pair of continuous electrodes bonded to opposite surfaces of said transducer along its length, said upper edge of said transmitting means contains a conductive coating and one of said transducer electrodes is bonded to said conductive coating.

5. An apparatus as in claim 4, wherein said high frequency electrical signal is applied across said transducer between the other of said electrodes and said conductive coating on said transmitting means.

6. An apparatus as in claim 5, wherein said transmitting means is a rectangular plate and said transducer means substantially extends along the length of an unimmersed edge.

* * * * *